US006483708B2

United States Patent
Ali et al.

(12) United States Patent
(10) Patent No.: US 6,483,708 B2
(45) Date of Patent: Nov. 19, 2002

(54) HEATSINK APPARATUS FOR DE-COUPLING CLAMPING FORCES ON AN INTEGRATED CIRCUIT PACKAGE

(75) Inventors: Hassan O. Ali, San Jose, CA (US); Richard L. Bechtel, Sunnyvale, CA (US)

(73) Assignee: Fujitsu Limited (JP)

(*) Notice: Subject to any disclaimer, the term of this patent is extended or adjusted under 35 U.S.C. 154(b) by 0 days.

(21) Appl. No.: 09/990,221

(22) Filed: Nov. 21, 2001

(65) Prior Publication Data

US 2002/0030972 A1 Mar. 14, 2002

Related U.S. Application Data

(63) Continuation of application No. 09/618,980, filed on Jul. 19, 2000.

(51) Int. Cl.[7] .................................................. H05K 7/20
(52) U.S. Cl. .................... 361/719; 257/719; 403/270
(58) Field of Search .................. 361/699, 700, 361/704, 705, 707, 709–713, 717–719; 174/16.3; 165/80.3, 185, 80.4, 104.33; 257/718, 719, 714, 726, 727; 403/265, 270

(56) References Cited

U.S. PATENT DOCUMENTS

| | | | | |
|---|---|---|---|---|
| 3,182,115 A | * | 5/1965 | Moran | |
| 3,955,122 A | * | 5/1976 | Maynard et al. | 361/710 |
| 4,167,031 A | * | 9/1979 | Patel | 361/709 |
| 4,597,617 A | | 7/1986 | Enochs | 339/17 |
| 5,713,690 A | | 2/1998 | Corbin, Jr. et al. | 403/270 |
| 5,786,635 A | * | 7/1998 | Alcoe et al. | 257/718 |
| 5,926,371 A | | 7/1999 | Dolbear | 361/704 |
| 5,945,736 A | | 8/1999 | Rife et al. | 257/719 |
| 6,018,194 A | * | 1/2000 | Moss et al. | 257/727 |
| 6,067,230 A | * | 5/2000 | Ashida et al. | 361/704 |
| 6,173,760 B1 | * | 1/2001 | Gardell et al. | 165/80.4 |

* cited by examiner

Primary Examiner—Gerald Tolin
(74) Attorney, Agent, or Firm—Fenwick & West LLP

(57) ABSTRACT

A clamping system decouples the clamping forces in an electrical circuit assembly coupled to a heatsink. A heatsink clamping assembly applies controllable and predictable force on the electrical circuit assembly including an integrated circuit device ("chip"). The applied force is controlled to effectively ensure intimate contact between the chip and the heatsink to facilitate efficient chip cooling. The force applied to the chip is decoupled from the much higher force required to clamp the electrical interposer interconnect structure between the electrical circuit assembly and the printed circuit board.

15 Claims, 4 Drawing Sheets

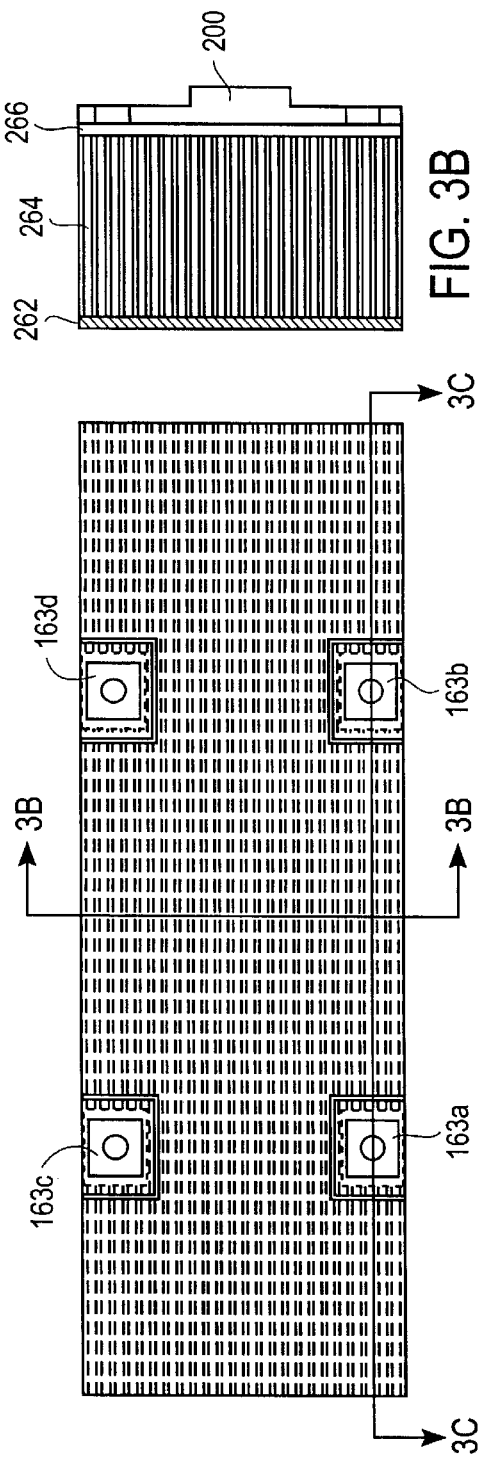
FIG. 3A
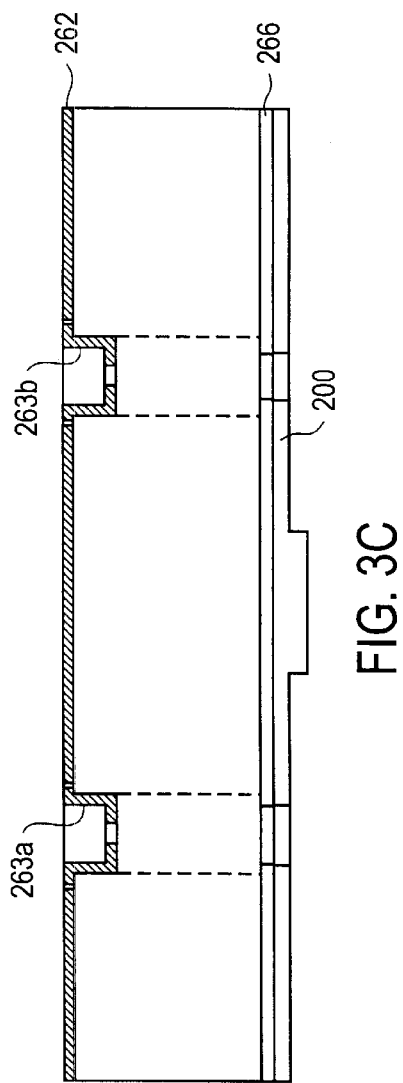
FIG. 3B
FIG. 3C

HEATSINK APPARATUS FOR DE-COUPLING CLAMPING FORCES ON AN INTEGRATED CIRCUIT PACKAGE

RELATED APPLICATIONS

This application is a divisional of U.S. patent Ser. No. 09/618,980, filed on Jul. 19, 2000, and which is hereby incorporated by reference.

BACKGROUND OF THE INVENTION

1. Field of the Invention

This invention relates generally to a system for attaching a heatsink to an integrated circuit device, and more particularly, to a system for clamping a heatsink to an integrated circuit device that applies controllable force onto the integrated circuit device.

2. Description of the Related Art

The use of integrated circuits is becoming more prevalent every day. Integrated circuits (ICs) are used in a multitude of different devices from household appliances to computer applications. However, ICs are also rather fragile. They are generally thin pieces of silicon on which circuits are constructed. These IC "chips" are subject to corrosion, environmental damage, physical shocks, and other damage mechanisms. For this reason, IC chips are packaged using a variety of different materials and package styles to protect them from possible damage during transportation and use.

Conventional protective packaging is generally a plastic or ceramic material used as a base for the IC chip and serving as a means of expanding ("fanning out") the electrical connections of the IC chip. The connections between the IC chip and the package are typically accomplished using wire bonds or, in the case of "flip chip," solder balls. In a "flip chip" arrangement, the top of the IC chip is flipped over face down onto the base package. Solder balls placed between the face of the chip and the base package provide electrical connections between the chip and the base package. Additionally, a lid may be attached over the IC to provide protection for the chip. The choice of protective packaging will be determined by various factors including the parameters of the chip itself, the IC application, and the packaging material cost.

In addition to providing chip protection, a component is also needed to allow the chip and package to make electrical connections to other devices. These connection components function as electrical components, with circuits that connect the chip to the Printed Circuit Board (PCB) or other device to which the chip is attached.

There are several different types of connection components allowing a chip and package to make electrical connections to a PCB. The selection of the appropriate electrical connection component will depend to a large extent upon the particular design of the chip itself, the number of connections required, and the size of the package. For example, for connections with a chip encased in a protective package that is no larger than 32 mm square (1.59 in$^2$) area, an array of solder balls (a ball grid array package or "BGA") may be used to make the electrical connections. Similarly, for packages no larger than 42 mm square (2.73 in$^2$) area, an array of solder columns (a column grid array package or "CGA") may be used to make the electrical connections. Both the ball and column grid arrays can be directly soldered to a PCB.

Both the ball and column grid array methods have a size limitation stemming from the long-term reliability of the connection. This limitation is mainly a function of the coefficient of thermal expansion (CTE) mismatch that typically exists between the IC package construction material and the PCB construction material. As a package gets larger the outermost connections from the center of the package may be stressed beyond their yield point as the IC chip heats the package. Therefore, for larger chips with a high lead count, or for more durable chip package systems, it is preferable to use an interposer component. An interposer provides an array of compressible contact points, such points being comprised typically of a polymer with imbedded electrically conductive metal or comprised of a metal spring structure. The required electrical connection is accomplished through contact pressure rather than a rigid bond. By being a compliant connection the interposer thus effectively decouples heat expansion stresses that can occur between the package and the PCB. However, when using an interposer to provide an electrical connection between a packaged IC and a PCB, considerable pressure must be applied to ensure a good low resistive electrical contact connection is achieved.

Certain IC chips also require the capability to dissipate a large amount of heat energy. For example, some high-powered chips may give off over 100 watts of heat energy. For such high-powered chips, the cooling provided by ambient air is not sufficient to prevent the chip from overheating. An additional component for removing the heat from the chip is required. A heatsink is commonly attached to an IC chip package, with a thermal interposer material in-between, in order to provide superior heat dissipation. The thermal interposer provides good thermal conductivity between the device and heatsink. In a conventional system, the heatsink may be attached, with a thermal interposer material in-between, to the package lid protecting the chip, or if no lid is used, directly to the chip itself.

The entire assembly consisting of the heatsink, the thermal interposer, the chip, the base package, and the electrical connection components, is clamped together to ensure proper electrical connections and heat transfer capabilities. Significant clamping force (often exceeding several hundreds of pounds) is required to clamp the chip-package-interposer-PCB arrangement tightly enough to ensure a proper electrical connection through the interposer. The heatsink-to-chip connection does not require a similar clamping force to provide heat transfer capability. However, because the entire assembly is clamped together when a conventional heat sink structure is used, all components are subjected to the same clamping force. This clamping force could damage the chip itself, even though a lid may be used, since the lid could compress into the underlying chip.

In the conventional packaged chip and heatsink arrangement where the chip is covered by a lid, the heatsink and thermal interposer do not contact the chip directly. Heat must pass through the air layer or other conductive layer between the chip and the lid, as well as through the lid itself, and the thermal interposer, before being dissipated by the heatsink. Such an arrangement makes it difficult to effectively cool certain high-powered chips. A preferable arrangement is to provide contact directly between the heatsink and the chip itself. This arrangement provides for superior heat transfer properties. However, without a lid present to absorb some of the compressive forces, extreme care must be taken to ensure that the chip is not crushed in this situation due to the clamping force required for the rest of the assembly.

Thus a high-powered chip packaging assembly that includes both a heatsink and an electrical interposer has two different, competing clamping force needs. Significant clamping force is required for achieving proper connections in the chip-package-electrical interposer-PCB portion of the assembly. However, significantly less clamping force is desirable between the chip-thermal interposer-heatsink assembly, to avoid damaging the chip. Thus, there is a need for a system that decouples the clamping forces between these two sections of the overall assembly.

SUMMARY OF THE INVENTIONS

The present invention provides a system that decouples the clamping force in an electrical circuit assembly coupled to a heatsink. A heatsink clamping assembly applies controllable and predictable force on the electrical circuit assembly including a packaged microelectronic integrated circuit device ("chip"). The applied force is controlled to effectively ensure intimate contact between the chip and the heatsink to facilitate efficient chip cooling. The force applied to the chip is decoupled from the much higher force required to clamp the interposer interconnection between the electrical circuit assembly and the printed circuit board. There are certain instances where the base of the heat sink may be a hollow chamber or heat pipe structure, and as such could be damaged if the full clamping force were required to be imposed.

In one embodiment, a heatsink clamping assembly comprises an electrical circuit assembly electrically connected to a printed circuit board (PCB). The electrical assembly includes an electrical circuit. A backing plate coupled to studs contacts the PCB, and the studs extend through apertures in the PCB. A clamp plate with a window contacts the edges of the electrical assembly while allowing the electrical circuit to pass through the window. The studs pass through the clamp plate, and a first pair of clamp nut assemblies clamps the electrical circuit assembly and PCB between the backing plate and the clamp plate.

A heatsink contacts a thermal interposer on top of the electrical circuit, and resides slightly above the clamp plate. The studs extend through the heatsink. A second pair of clamp nut assemblies connects the heatsink to the backing plate. The force used upon the first and second pairs of clamp nut assemblies may differ, thereby decoupling the two forces.

In one embodiment, the electrical circuit assembly comprises an electrical circuit, a package electrically coupled to the electrical circuit, and an electrical interposer electrically coupled to the package. The electrical interposer provides an electrical connection to the PCB. In one embodiment, the electrical circuit is an integrated circuit flip chip.

The features and advantages described in the specification are not all-inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 3 is a top view of a heatsink and two vertical sliced views of the heatsink in an embodiment of the present invention.

The figures depict a preferred embodiment of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

Reference will now be made in detail to several embodiments of the present invention, examples of which are illustrated in the accompanying drawings. Wherever practicable, the same reference numbers will be used throughout the drawings to refer to the same or like parts.

Figure 1A:
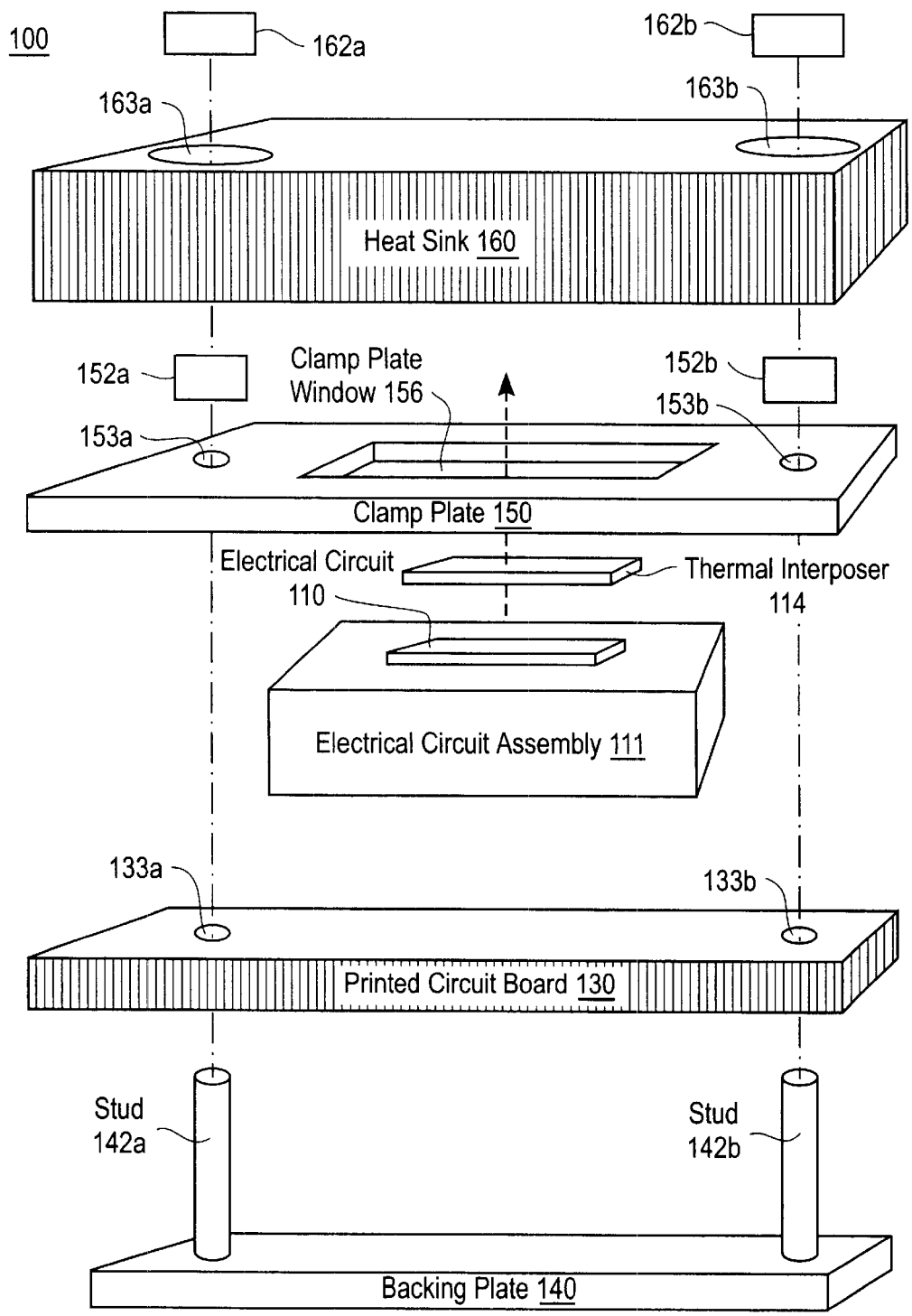
FIG. 1A is an exploded three-dimensional view of the elements of a clamping assembly for an integrated circuit with a heatsink in an embodiment of the present invention.

FIG. 1A is an exploded view of the components in an embodiment of a clamping assembly 100. Clamping assembly 100 includes an electrical circuit assembly 111, a printed circuit board ("PCB") 130, a backing plate 140, a clamp plate 150, a thermal interposer 114, and a heatsink 160. Clamping assembly 100 has a first clamped group of components and a second clamped group of components, wherein the first and second groups may be clamped together using different amounts of force.

The first clamped group of components includes the electrical circuit assembly 111, the PCB 130, the backing plate 140 and the clamp plate 150. Electrical assembly 111 includes an electrical circuit 110; however, no clamping force is applied to the electrical circuit 110 within the first clamped group of components. Backing plate 140 is connected to two studs 142A and 142B. PCB 130 includes two apertures 133A and 133B, dimensioned to allow the studs 142 to pass through. Clamp plate 150 includes two apertures 153A and 153B, dimensioned to allow the studs 142 to pass through. Clamp plate 150 also includes a clamp plate window 156, which runs through the clamp plate 150, and is dimensioned to fit around the electrical circuit 110 and prevent the electrical circuit 110 from being subjected to the clamping force applied to the first clamped group of components. A pair of clamp nut assemblies 152A and 152B clamp onto the studs 142 above the clamp plate 150, and may be adjusted to provide the first clamped group of components with the desired clamping force.

The electrical circuit assembly 111 and the PCB 130 must be mated together tightly in order to assure a good electrical connection between their components. Typically, a force of approximately 60–80 grams per contact (0.13–0.18 pounds per contact) is required to assure proper electrical contact. This translates into a stud 142 clamping force of approximately 90–120 kilograms force (190–260 pounds force). Because the electrical circuit 110 passes through the clamp plate window 156, this force is not applied to the electrical circuit 110.

The second clamped group of components clamps the electrical circuit 110 to the heatsink 160, with the thermal interposer 114 in-between. The heatsink 160 includes two apertures 163A and 163B, dimensioned to allow the studs 142 to pass through. A pair of clamp nut assemblies 162A and 162B clamps onto the studs 142 above the heatsink 160, and may be adjusted to provide the second clamped group of components with the desired clamping force.

The clamp plate 150 is dimensioned to approximately match the thickness of the electrical circuit 110. Thus, when the heatsink 160 is clamped on top of the clamp plate 150, the heatsink 160 contacts both the clamp plate 150 and the electrical circuit 110, with the thermal interposer 114 in-between, and provides a thermal conducting connection for removing heat from the electrical circuit 110. Maintaining a proper thermal conducting connection requires significantly less clamping force than the electrical connection between the PCB 130 and the electrical circuit assembly 111. A stud 142 clamping force of approximately 4.5–6.8 kilograms force (10–15 pounds force) is applied to the second clamping group to provide a good thermal conduction connection between the heatsink 160 and the electrical circuit 110.

The backing plate 140 and the clamp plate 150 are composed of a rigid material. In one embodiment, the backing plate 140 and the clamp plate 150 are composed of steel. Heatsink 160 is composed of any highly thermally conductive material, for example, aluminum, copper, or even some impregnated polymer material. In some cases, a combination of materials are used, for example: aluminum for the heat sink fin structure and copper for a heat sink base or heat sink base heat pipe. The studs 142 and nut clamping assemblies 152 and 162 are composed of a rigid material capable of carrying a significant clamping force. The dimensions of the PCB 130, backing plate 140, clamp plate 150, thermal interposer 114, and heatsink 160 are dependent upon the size of the electrical circuit 110 and the electrical circuit assembly 111. The PCB 130, backing plate 140, clamp plate 150 and heatsink 160 are all dimensioned to have a surface area large enough to accommodate apertures surrounding the electrical circuit assembly 111 to allow the studs 142 to pass through for clamping. The studs 142 are dimensioned to be sufficiently long enough to pass through the PCB 130, electrical circuit assembly 111, clamp plate 150, thermal interposer 114, and heatsink 160 and connect to the clamp nut assemblies 152 and 162.

Figure 1B:
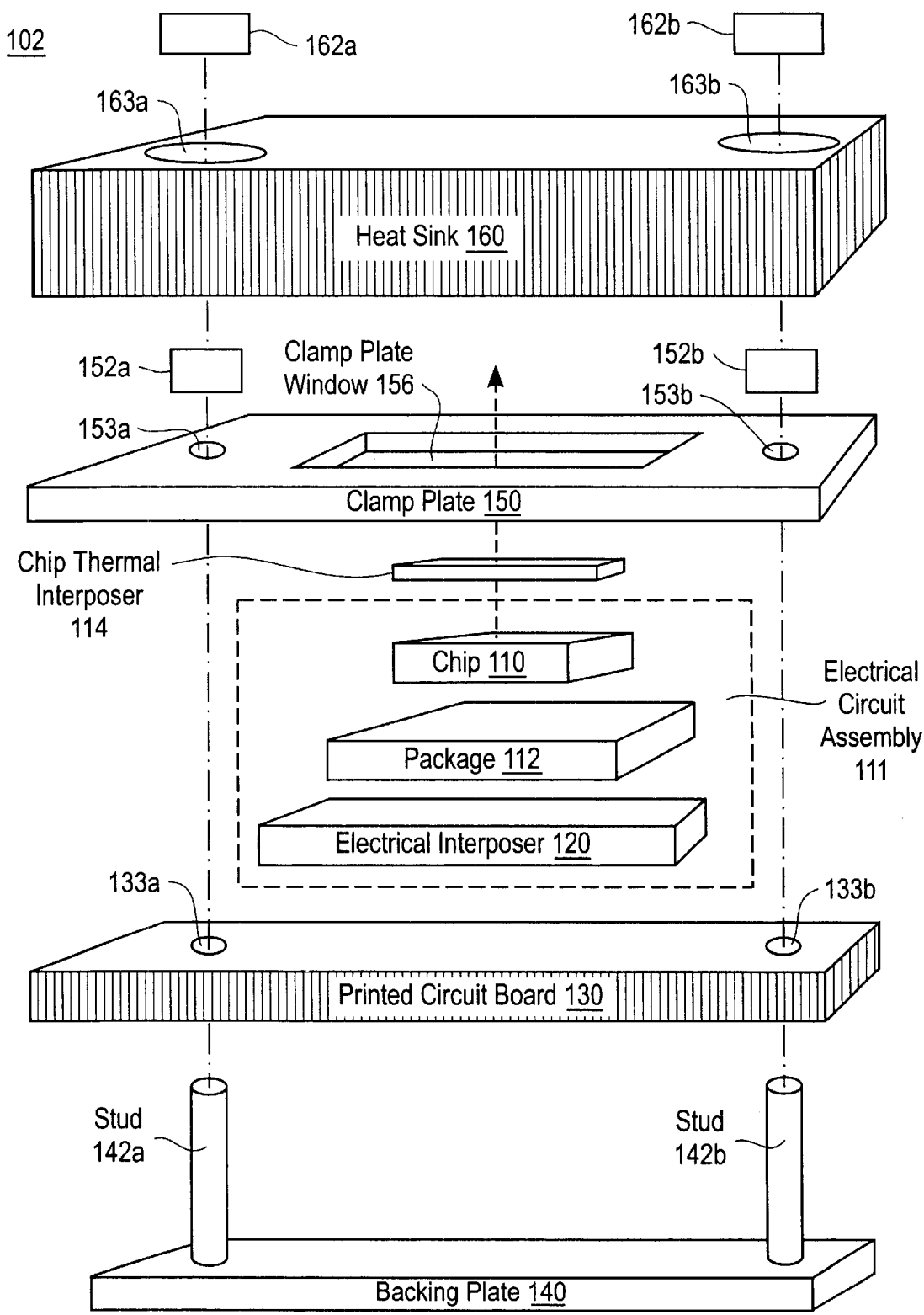
FIG. 1B is an exploded three-dimensional view of the elements of a clamping assembly for an integrated circuit with a heats ink in another embodiment of the present invention.

FIG. 1B is an exploded view of the components in another embodiment of a clamping assembly 102. Clamping assembly 102 similarly contains a first and a second clamped group of components as described regarding clamping assembly 100. However, in clamping assembly 102, the electrical circuit is an integrated circuit ("IC") chip 110. The electrical circuit assembly 111 is a package 112 and an electrical interposer 120. Clamping assembly 102 decouples the force applied to the first clamped group of components (package 112, electrical interposer 120, PCB 130, backing plate 140, and clamp plate 150) from the force applied to the second clamped group of components (IC chip 110, chip thermal interposer 114, and heatsink 160).

Package 112 holds and protects the IC chip 110 and provides electrical connections to the chip 110. The electrical interposer 120 provides an electrical connection between the IC chip 110 connections (through the package 112) and the PCB 130. Clamping assembly 102 further includes a chip thermal interposer 114, which provides a thermal conducting layer between the chip 110 and the heatsink 160.

Clamping assembly 102 is designed for the particular needs of chips that have the following characteristics: (1) they are high-wattage chips, typically greater than 100 watts, and (2) they have high electrical interconnect counts, requiring relatively large chips, typically 20 mm square (0.62 in$^2$) in area or larger. High-wattage chips typically generate too much heat to use a lidded package configuration, and it is preferable to attach a heatsink directly onto the back of the chip through a thermal interposer. Large chips require large packages, and as discussed previously, an electrical interposer 120 is more suitable than ball or column grid arrays for providing larger IC chip packages with electrical connections to a PCB.

Thus IC chip 110 is typically a high-wattage chip emitting approximately 100 watts or more, and is typically 20 mm square or larger in size. However, it will be evident to one of skill in the art that the clamping assembly of the present invention may be used with smaller IC chips of lower wattage. In order to further protect the IC chip 110, and improve the heat transfer capabilities between the IC chip 110 and the heatsink 160, clamping assembly 102 includes the chip thermal interposer 114. Chip thermal interposer 114 may be a layer of a conductive material such as silicone grease or a thermal epoxy that coats the IC chip 110.

The IC chip 110 is attached to the package 112. The package 112 may be one of a number of different types of IC chip packages. In one embodiment, a "flip chip" type of IC chip 110 and package 112 is used. In a "flip chip," the IC chip 110 is flipped over onto the package 112 so that the bond pads on the top of the IC chip 110 are directly above the top of the package 112, which contains a footprint of the IC chip 110 electrical connections. The bond pads between the IC chip 110 and package 112 have solder balls bonded to them that form physical and electrical connections between the IC chip 110 leads and the package 112.

In one embodiment, package 112 is composed of a ceramic material. In another embodiment, package 112 is composed of a plastic or laminate material. The size of the package 112 is determined by the size of the IC chip 110. Package 112 is dimensioned to be larger in area than the IC chip 110, allowing a portion of the package 112 to provide surface contact with the clamp plate 150 as the IC chip 110 passes through the clamp plate window 156. In one embodiment including an IC chip of approximately 20 mm square, the package size is approximately 45 mm square (3.14 in$^2$) area or larger. It will be evident to one of skill in the art that a smaller package may be used if a smaller IC chip is used.

The electrical interposer 120 provides an electrical connection between the package 112 and the PCB 130. The electrical interposer 120 consists of a sheet of carrier material that captures an array of compressible conductive buttons that have pieces of electrically conductive material embedded within them to connect leads on the package 112 to leads on the PCB 130. In one embodiment, the membrane material is a polyamide film. In another embodiment, a ceramic or polymer frame contains an array of spring-like structures typically made of gold-plated or silver-plated beryllium, copper, molybdenum, or similar metals. The electrical interposer 120 is sized to be as large or slightly larger than the package 112. Thus, for a package size of approximately 45 mm square, the electrical interposer size will be approximately 50 mm square. The dimensions of the PCB 130, backing plate 140, clamp plate 150 and heatsink 160 are dependent upon the size of the IC chip 110, the package 112, and the electrical interposer 120.

In one embodiment, the heatsink 160 includes a heat pipe that thermodynamically connects to the IC chip 110 through the chip thermal interposer 114. A heatsink 160 including a heat pipe typically provides superior heat transfer properties compared to the heatsink alone. A heat pipe is a block of a conductive metal, such as copper, with a hollow cavity inside. The cavity is airtight and maintained at a partial vacuum, and contains a fluid selected for its boiling temperature. Water is often selected for the fluid, as are various alcohols. Heat contacting one side of the heat pipe vaporizes the water within the partial vacuum, and the vapor transfers heat to the heat sink side of the heat pipe where it condenses. In this manner, heat is spread over the base of the heat sink very efficiently, as the heat pipe wicks heat away from the IC chip 110 and transfers it to the heatsink 160.

A heat pipe is hollow and therefore somewhat fragile. However, because the clamping assembly 102 decouples the clamping force applied to the heatsink 160 from the clamping force applied to the other components, a low clamping force loading on the heat pipe may be achieved as necessary.

Figure 2:
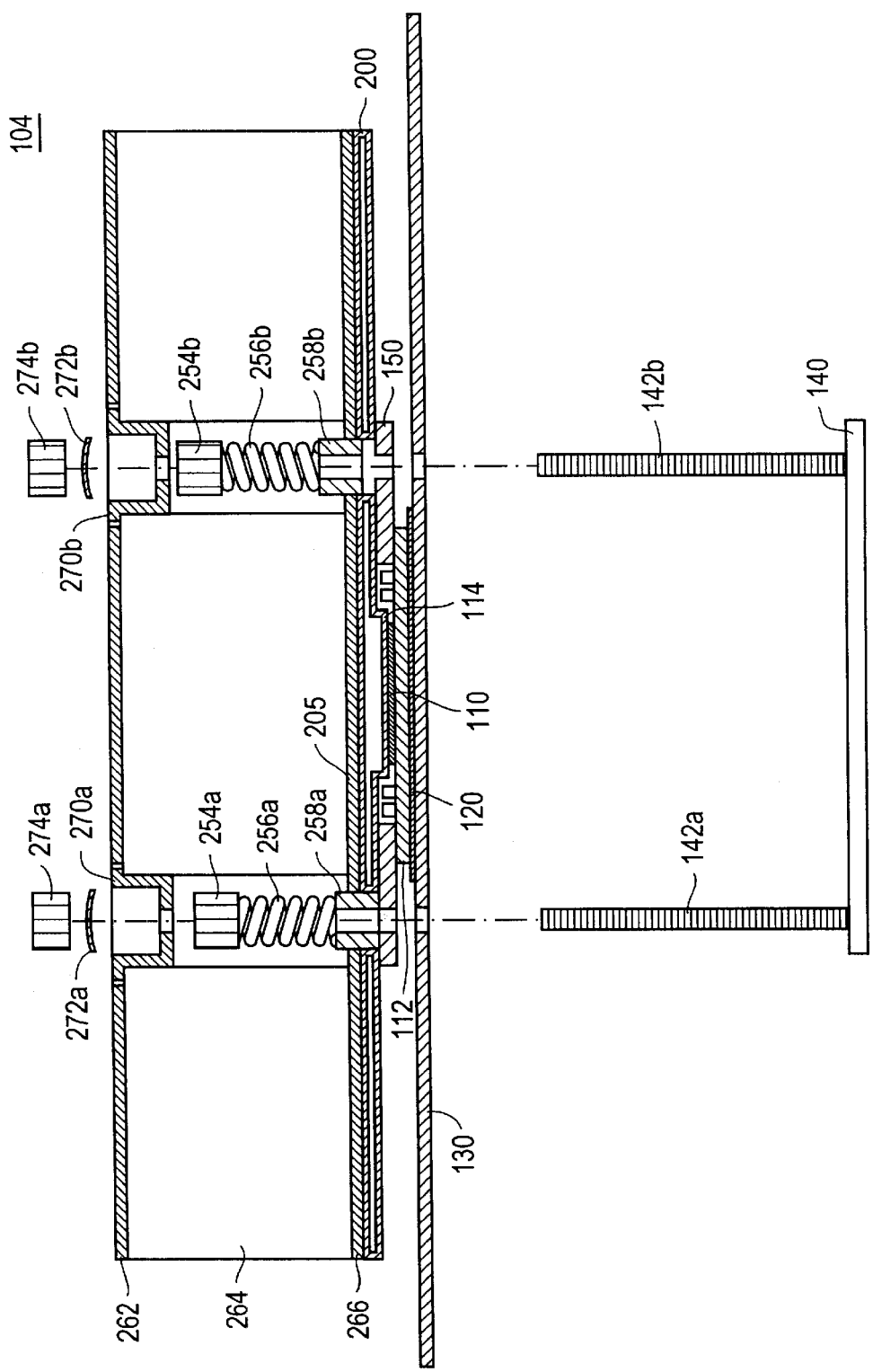
FIG. 2 is a cut-away view of the layers of a clamping assembly for an integrated circuit with a heatsink in an embodiment of the present invention.

FIG. 2 is a cut-away view of the layers of another embodiment of a clamping assembly 104 for an electrical circuit with a heatsink. The heatsink of clamping assembly 104 includes a heat pipe 200. The backing plate 140 and studs 142 are shown separated from the rest of the clamping assembly 104. When clamping assembly 104 is fully assembled, the backing plate 140 contacts the PCB 130 and forms the bottom layer of the clamping assembly 104.

Moving from the bottom to the top of the clamping assembly 104, the following components comprise a first group of clamped components: the backing plate 140 contacts the PCB 130; the PCB 130 contacts the electrical interposer 120; and the electrical interposer 120 contacts the package 112. The top surface of package 112 that is external to the chip also contacts the clamp plate 150. The package 112 is attached to the IC chip 110; however, the IC chip 110 passes through the clamp plate window and therefore does not contact the clamp plate 150. The IC chip 110 is therefore not included in the first clamped group of components.

The studs 142 are connected to the backing plate 140 and pass through apertures in the PCB 130 and clamp plate 150. The first group of clamped components between the clamp plate 150 and the backing plate 140 are clamped together through a first clamping assembly that connects onto the pair of studs 142A and 142B. The first clamping assembly consists of a pair of clamping pressure transfer bushings 258A and 258B, a pair of clamp springs 256A and 256B, and a pair of clamp nuts 254A and 254B.

Moving from the top of the first clamped group of components to the top of the entire clamping assembly 104, the following components comprise a second group of clamped components: the IC chip 110 contacts the chip thermal interposer 114 (for example, a thin layer of grease or silicon); the chip thermal interposer 114 contacts a heat pipe 200; the heat pipe 200 contacts a bonding material layer 205; and the bonding material layer 205 bonds the heat pipe 200 to a heatsink. The heatsink includes a heatsink bottom plate 266, a set of heatsink fins 264, and a heatsink top plate 262.

The studs 142 pass through apertures in the heat pipe 200, the heatsink bottom plate 266 and the heatsink top plate 262. The second group of clamped components is clamped together through a second clamping assembly that connects onto the pair of studs 142A and 142B. The second clamping assembly consists of a pair of inserts 270A and 270B, a pair of spring washers 272A and 272B, and a pair of clamp nuts 274A and 274B.

FIG. 3 is a top view of a heatsink that requires 4 studs. FIG. 3 includes two different vertical sliced views through the heatsink, in an embodiment of the present invention. View 301 includes a heat pipe 200, a heatsink bottom plate 266, a set of heatsink fins 264, and a heatsink top plate 262. View 302 is a vertical slice through the heatsink along the apertures 163A and 163B, illustrating the apertures 163 in the heatsink top plate 262, the heatsink bottom plate 266, and the heat pipe 200 that allow the studs to pass through the heatsink. View 302 also illustrates that the heat sink top plate 262 includes a set of recessed cavities 263A and 263B around each aperture 163, allowing the heat sink clamping assemblies to be recessed into the heatsink itself.

In FIG. 3, the heatsink is shown to include four apertures (163A, B, C and D) dimensioned to allow a set of four studs to pass through the heatsink for use in clamping together the clamping assembly. It will be evident to one of skill in the art that the clamping assembly may be designed to have different numbers of studs used for clamping. For example, in one embodiment, there is a pair of two studs. In another embodiment, a set of four studs is used. The number of apertures through the heatsink, PCB and clamp plate component of the clamping assembly corresponds to the number of studs used.

In one embodiment, the clamping assembly includes several different IC chips. In this embodiment, a single large heatsink removes heat from several different IC chips. The clamp plate contains several windows corresponding to the number of IC chips, or one large window to encompass all the chips, or any combination of windows between, dimensioned to allow an IC chip to pass through and contact the heatsink directly. The clamping assembly components are dimensioned to accommodate the area of several IC chips as well as the apertures used to allow the studs to pass through the clamping assembly.

Although the invention has been described in considerable detail with reference to certain embodiments, other embodiments are possible. As will be understood by those of skill in the art, the invention may be embodied in other specific forms without departing from the essential characteristics thereof For example, different types of electrical circuit assemblies may be used within the invention. Additionally, a heat pipe may be included in the heatsink assembly. Accordingly, the present invention is intended to embrace all such alternatives, modifications and variations as fall within the spirit and scope of the appended claims and equivalents.

What is claimed is:

1. A clamping system for electrical assembly systems, comprising:

an electrical circuit assembly having a first surface and a second surface;

an electrical circuit mounted on the first surface of the electrical circuit assembly and electrically coupled to the electrical circuit assembly;

a first set of electrical contacts mounted on the second surface of the electrical circuit assembly and electrically coupled to the electrical circuit assembly;

a printed circuit board including a second set of electrical contacts;

a clamp plate mounted on the first surface of the electrical circuit assembly dimensioned not to overlap with the electrical circuit;

a first clamping assembly mechanically coupling the clamp plate to the printed circuit board and configured to apply a first force onto the first surface of the electrical circuit assembly by compressing the electrical circuit assembly between the clamp plate and the printed circuit board, the first force contributing to an electrical coupling between the first set of electrical contacts and the second set of electrical contacts;

a heatsink assembly mounted on the electrical circuit; and a second clamping assembly mechanically coupling the heatsink assembly to the printed circuit board and configured to apply a second force onto the electrical circuit by compressing the electrical circuit between the heatsink assembly and the printed circuit board, the second force contributing to a thermodynamic coupling between the heatsink assembly and the electrical circuit.

2. The clamping system of claim 1, wherein the clamp plate further includes a window.

3. The clamping system of claim 2, wherein the window bounds four sides of the electrical circuit.

4. The clamping system of claim 2, wherein the window bounds three sides of the electrical circuit.

5. The clamping system of claim 1, wherein the heatsink assembly comprises:

a heatsink bottom plate; and a thermal interposer mounted between the heatsink bottom plate and the electrical circuit.

6. The clamping system of claim 5, wherein the thermal interposer is a silicone grease.

7. The clamping system of claim 1, wherein an electrical interposer is mounted on the second surface of the electrical circuit assembly and electrically couples the first set and the second set of electrical contacts.

8. A clamping system for decoupling clamping forces on an electrical circuit assembly comprising:

an electrical circuit assembly including an electrical circuit;

a printed circuit board electrically coupled to the electrical circuit assembly;

a clamp plate for applying a first predetermined force onto the electrical circuit assembly, the clamp plate mounted on the electrical circuit assembly and mechanically coupled to the printed circuit board; and a heatsink thermally coupled to the electrical circuit, the heatsink further mechanically coupled to the printed circuit board and configured to apply a second predetermined force onto the electrical circuit, the second predetermined force being applied independent of the first predetermined force.

9. The clamping system of claim 8, wherein the first predetermined force is of greater magnitude than the second predetermined force.

10. The clamping system of claim 8, wherein the heatsink comprises a hollow chamber.

11. The clamping system of claim 8, wherein the first predetermined force is a clamping force clamping the electrical circuit assembly between the clamping plate and the printed circuit board.

12. A method for clamping electrical circuit assemblies, comprising the steps of:

clamping with a first clamping assembly a first group of components comprising a printed circuit board and an electrical circuit assembly having an electrical circuit; and clamping with a second clamping assembly a second group of components comprising the electrical circuit, and a heatsink assembly, whereby clamping forces clamping the first group of components are applied independently of the clamping forces clamping the second group of components.

13. The method of claim 12, wherein the second group of components also includes the printed circuit board.

14. The method of claim 13, wherein the second group of components includes a thermal interposer.

15. The method of claim 12, wherein the clamping forces clamping the first group of components are of different magnitude than the forces clamping the second group of components.

* * * * *